United States Patent [19]

Corbel et al.

[11] Patent Number: 4,672,452

[45] Date of Patent: Jun. 9, 1987

[54] DEVICE FOR THE AUTOMATIC PRECORRECTION OF NON-LINEARITIES IN A POWER AMPLIFICATION CHAIN FOR A TELEVISION TRANSMITTER

[75] Inventors: Philippe Corbel, Sartrouville; Michel Allanic, Herblay, both of France

[73] Assignee: Thomson-LGT Laboratoire General des Telecommunications, Chatou, France

[21] Appl. No.: 663,732

[22] Filed: Oct. 22, 1984

[30] Foreign Application Priority Data

Oct. 21, 1983 [FR] France .................................. 83 16795

[51] Int. Cl.⁴ .............................................. H04N 5/40
[52] U.S. Cl. .................................... 358/187; 358/143; 455/295
[58] Field of Search ............... 358/186, 187, 142, 143; 455/295, 303, 305; 328/162, 163, 143

[56] References Cited

U.S. PATENT DOCUMENTS

| 3,825,843 | 7/1974 | Felsberg et al. | 328/163 |
| 4,168,511 | 9/1979 | Chabanel | 358/186 |
| 4,392,252 | 7/1983 | Cluniat | 358/186 |
| 4,535,361 | 8/1985 | Corbal | 358/186 |

FOREIGN PATENT DOCUMENTS 2275065 1/1976 France .

Primary Examiner—Tommy P. Chin
Attorney, Agent, or Firm—Pollock, VandeSande & Priddy

[57] ABSTRACT

A device for the automatic precorrection of non-linearities of a power amplification chain in a common channel television transmitter. The device has a first circuit for detecting the component to be corrected prior to amplification and addition of the components to be simultaneously amplified, a circuit for selecting the same components after amplification in a common channel, an attenuator of the latter component having an attenuation coefficient equal to the linear part of the amplification chain gain, a second detection circuit, an analog divider receiving the two detected components, whereof the output is coupled to the precorrection control input of a precorrection circuit upstream of the first precorrection circuit.

6 Claims, 4 Drawing Figures

DEVICE FOR THE AUTOMATIC PRECORRECTION OF NON-LINEARITIES IN A POWER AMPLIFICATION CHAIN FOR A TELEVISION TRANSMITTER

BACKGROUND OF THE INVENTION

1. Field of the Invention

The invention relates to a device for the automatic precorrection of non-linearities, cross modulation and/or intermodulation, in a power amplification chain. Its particular field is that of television transmitters and rebroadcasting transmitters, in which the signal to be transmitted is an amplitude-modulated signal. Thus, when power amplifiers have non-linearities, the amplitude modulation of the signal to be transmitted undergoes a distortion which is prejudicial to the quality of the signal received.

In television transmitters having two separate amplification chains, one used for the amplification of the picture video signal and the other for the amplification of the audio-frequency signal, the deficiencies resulting from the non-linearities of the amplifiers lead to an intermodulation of the amplified signal, i.e. a spurious signal is superimposed on the modulation signal to be transmitted. In the case of common channel television transmitters, i.e. in which the video frequency signal and the audio-frequency signal, both in amplitude-modulated form, are simultaneously transmitted and amplified, the non-linearities in the amplification chain on the one hand lead to an intermodulation spurious signal on each of the modulated carriers, and on the other hand to a spurious cross modulation signal due to the modulation transfer between the individual carriers.

The quality criteria for television transmitters or rebroadcasting transmitters are such that the noise, i.e. the spurious signals must be at a level of 60 decibels below the useful signal. However, when no correction is made, noise level is only 20 decibels below the useful signal. It is therefore absolutely indispensable to use non-linearity correction means in such systems.

2. Description of the Prior Art

French Pat. No. 2 275 065, corresponding Great Britian Pat. No. GB P 1 491 798 in the name of the present Applicant, described a correction circuit which is particularly suitable for the corrections of non-linearities of the third order in a transmitter with separate channels. In this circuit, the signals at the input and output of the amplification chain are detected, the signal at the chain output also being divided by a coefficient equal to the linear part of the amplification chain gain, said two signals being compared in a subtracter, which supplies an error signal at the angular frequency of the subcarrier to be corrected. This error signal is then added to the input signal in a precorrection circuit preceding the amplification stages. Such a precorrection device is very suitable for the correction of intermodulation, but does not make it possible to conveniently correct the distortion due to the cross modulation between individual carriers in a common channel transmitter. Thus, such a system makes it possible to appropriately correct a constant power subcarrier. However, when the subcarrier to be corrected is itself amplitude-modulated, and consequently has a variable instantaneous power, this correction circuit does not permit the correction thereof in its complete variation range.

SUMMARY OF THE INVENTION

The invention relates to a device for the automatic correction of non-linearities in a power amplification chain, particularly the non-linearities due to cross modulation in a common channel television transmitter, which makes it possible to improve the quality of the equipment and which does not suffer from the limitations of the previously described system.

Thus, the present invention specifically relates to a device for the precorrection of non-linearities in a power amplification chain of a television transmitter, having two channels respectively connected to the input and to the output of the amplification chain for sampling part of the transmitted signal, each having a detection circuit receiving the sampled signal, the channel connected to the amplification chain also having an attenuator with an attenuation coefficient equal to that part of the gain of the chain which is independent of the input signal, wherein the outputs of the two channels are connected to the inputs of an analog divider, whereof the output is coupled to the control input of an adjustable attenuation precorrection circuit, which is placed upstream of the branch preceding the amplification chain.

BRIEF DESCRIPTION OF THE DRAWINGS

Other characteristics and advantages of the present invention will appear from reading through the following description with reference to the annexed drawings, given simply by way of example and in which:

FIG. 1 is a block diagram of an embodiment of the automatic precorrection device according to the invention.

DESCRIPTION OF THE PREFERRED EMBODIMENTS

Figure 2:
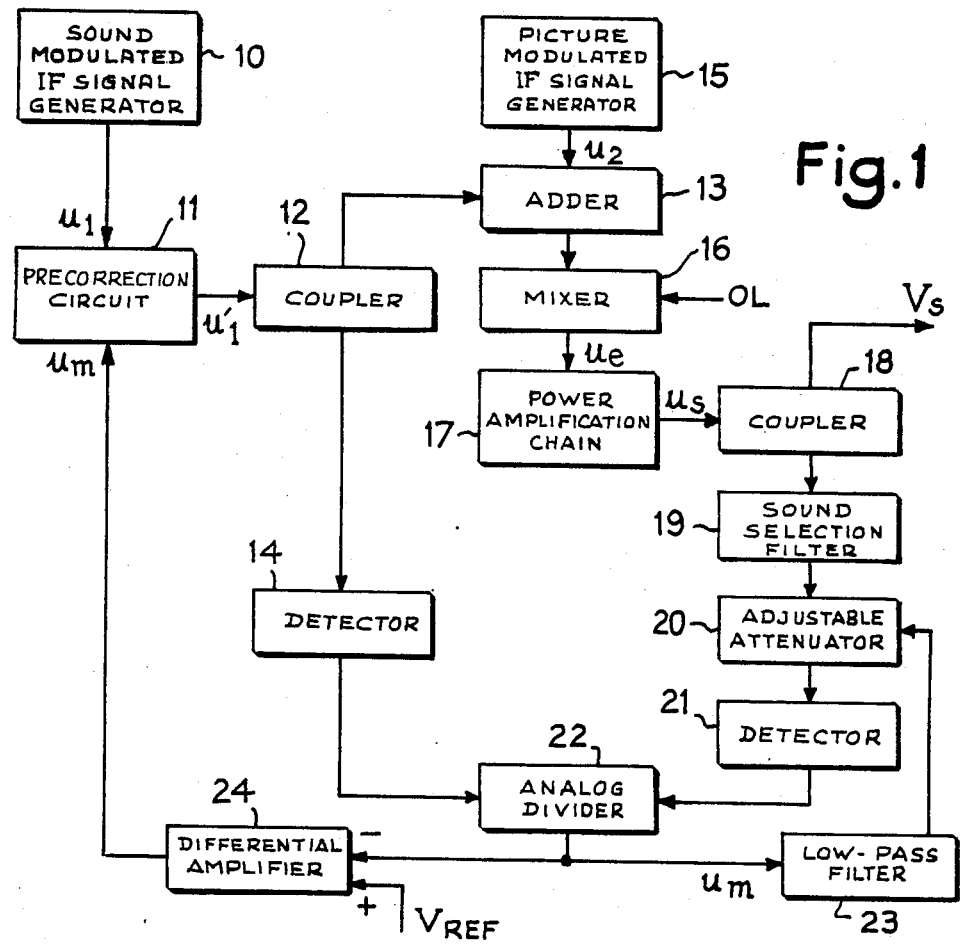
FIGS. 2 and 3 are detailed diagrams of certain elements of the device of FIG. 1.

As indicated hereinbefore, when two signals with different subcarriers are simultaneously transmitted to an amplification chain with a view to being amplified together, and when the amplification chain is not perfectly linear, which occurs when the amplifiers are used in a relatively wide range of their characteristic $V_s = f(V_e)$ for increasing the efficiency of the amplification chain and consequently in the non-linear portions of said characteristic, the output voltage of the amplification chain is no longer strictly proportional to the input voltage. There appear terms which are a function of the square of the input voltage, terms which are a function of the cube of the same voltage, etc. The developed calculation of the different components of the output signal shows that the terms which are a function of the cube of the input voltage lead to the appearance of signals at the pulsations of the subcarrier frequencies constituting the input signal. In the case of terms which are a function of the square of the input voltage, no such signals appear. In the components at one of the input carriers, one is the result of intermodulation, i.e. a distortion signal due to the modulation of the actual subcarrier, while the other is a spurious signal produced by the other carrier. Thus, for a common channel-amplified television signal, the second signal being $u_1 = P_a(t) \cos \cdot \omega_a(t)$ and the picture signal $u_2 = P_i(t) \cos \cdot \omega_i(t)$, if $u_e$ is the sum of these two voltages and the output voltage $u_s$ of the amplification chain is equal to $k_1 u_e + k_2 u_e + k_3 u_e^3$, said output voltage is expressed as a function of the picture and sound components at the input in the following way:

$$u_s = k_1 P_a \cos \omega_a(t) +$$

$$k_1 P_i \cos \omega_i(t) +$$

$$\tfrac{3}{4} k_3 P_a (P_a^2 + 2P_i)^2 \cos \omega_a(t) +$$

$$\tfrac{3}{4} k_3 P_i (2P_a^2 + P_i)^2 \cos \omega_i(t) +$$

...

In order to carry out intermodulation and cross modulation corrections simultaneously, for the complete power range of the carriers, the correction device has for correcting each carrier a system for filtering components of the frequency of said carrier, followed by a coefficient attenuator equal to that part of the amplification chain gain which is independent of the input signal and which processes the output signal of the amplification chain. Following detection, the signal is divided by the input signal of the amplification chain and the output signal of the divider supplying a precorrection signal applied to the control input of an adjustable attenuator receiving the signal from the corresponding channel prior to summation with the signal of the other channel.

FIG. 1 is a block diagram of the automatic correction device according to the invention for correcting one of the carriers. As will be shown hereinafter, an identical channel must be provided for correcting the other carrier.

FIG. 1 shows a sound-modulated, intermediate frequency signal generator 10. Its output supplies the signal in intermediate frequency, amplitude-modulated by the audio-frequency signal, i.e. $u_1$. The output of this generator is connected to the signal input of a precorrection circuit 11, whose output is connected to the input of a coupler 12, which transmits most of the input signal to the first input of an adder 13 and a fraction $u_1/K$ of this signal in a parallel channel to the input of an amplitude modulation detector 14.

A picture-modulated, intermediate frequency signal generator 15 has its output connected to the second input of adder 13 and supplies the intermediate frequency signal modulated in amplitude by the video signal. Thus, the adder output supplies a composite signal, which is then transferred in radio frequency, i.e. at the transmission frequency, in a mixer 16 having a local oscillator input at the transmission frequency OL. The output of this mixer is connected to the input of a power amplification chain 17, which consequently receives the composite signal and the transmission frequency $u_e$. The output signal of the power amplification chain $u_s$ is applied to the input of a coupler 18, which transmits most of it to the output with a view to its transmission, and which samples a fraction $u_s/K$ in a second parallel channel with the object of carrying out automatic distortion correction. The parallel output of coupler 18 is connected to the input of a filter 19 for selecting the sound carrier in radio-frequency. The output of this filter is connected to the input of an adjustable attenuator 20, whose output is connected to the input of an amplitude modulation detector 21.

The outputs of detectors 14 and 21 are connected to the inputs of an analog divider 22, whose output is coupled on the one hand to the control input of the precorrection circuit 11 for the precorrection of the distortion via a differential amplifier 24, and on the other hand to the control input of the adjustable attenuator 20, via a low-pass filter 23. Attenuator 20 cancels out slow variation in that part of the power amplifier chain gain which is independent of the input voltage, by varying the attenuation of attenuator 20 in the same way. These slow variations can be a function of the temperature or can be brought about by ageing of the components.

Thus, at the output of the fast analog divider 22, voltage $u_m$ is formed from a d.c. voltage which will be cancelled out in the control loop of precorrection circuit 11, a signal characteristic of the sound intermodulation proportional to $\tfrac{3}{4} \cdot (k_3/k_1) P_a^2$, and a signal characteristic of the cross modulation of the sound carrier produced by the picture carrier proportional to $3/2(k_3/k_1) P_i^2$. The differential amplifier 24 makes it possible to reverse this voltage, cancel out its d.c. component independent of the modulation signal $P_a(t)$ by means of a reference voltage $V_{REF}$, and adjust the correction effectiveness coefficient. It thus supplies the precorrection control signal applied to the precorrection circuit of the sound distortion components, which controls a variation of the attenuation coefficient of the correction circuit, as a function of the input voltage which is the reverse of that of the amplification chain gain.

The precorrection circuit must not distort the signal to be transmitted, said signals generally being high level signals. Moreover, it must have a linear control law and a very short response time, because it must follow the modulation components. Finally, it must not integrate the control voltage applied to its input. Thus, according to a preferred embodiment of the invention, the precorrection circuit 11 is an adjustable attenuator formed from a fast PIN diode mixer.

This embodiment of the adjustable attenuator 11 is shown in FIG. 2. It comprises an input transformer $T_1$, to whose primary is applied the sound amplitude-modulated intermediate frequency signal $u_1$. The center of the secondary of the transformer $T_1$ is connected to earth, while the ends of this secondary are connected to two opposite terminals of the fast PIN diode mixer MX. The other two opposite terminals of the diode mixer are connected to the ends of the primary of the second transformer $T_2$, whose center receives the correction control signal $u_c = -(\alpha u_m - V_{REF})$, $\alpha$ being the correction efficiency coefficient. The secondary of transformer $T_2$ supplies a sound amplitude-modulated intermediate frequency signal, which is precorrected in order to compensate distortions subsequently introduced by the power amplification chain as a result of the non-linearities.

For the automatic correction device to operate satisfactorily, it is necessary for the amplification chain transfer time to be as short as possible. In the same way, in the filter 19 for selecting components at the transmission frequency of sound (or in the filter for selecting the components at the transmission frequency of the picture in the case where the loop relates to the correction of the picture carrier), it is necessary for the transfer time to be as short as possible, it also being necessary for the filter to be very selective. In all cases, this filter transfer time must be less than 100 or 150 nanoseconds. Therefore, according to a preferred embodiment of the invention, selection filter 19 is a filter for rejecting components at the picture carrier frequency (or sound carrier frequency in the case of correcting the picture component). Moreover, in order that the system functions correctly, the detectors 14 and 21 respectively processing the modulated signal before and after power amplification, must be as similar as possible, so that the analog divider reveals true distortion components.

Figure 3:
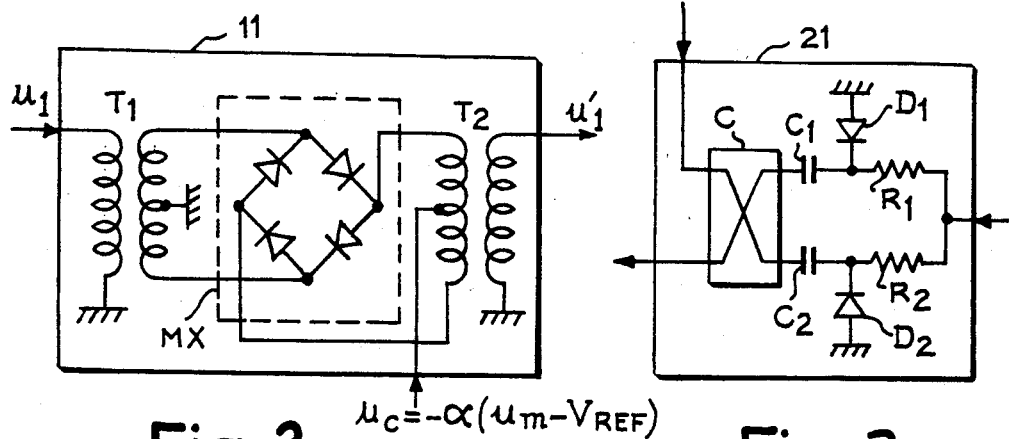

As stated hereinbefore, adjustable attenuator 20 takes account of the development of the power amplification chain gain component $k_1$, which is independent of the input voltage. Thus, if this gain develops in time or as a function of the temperature and the attenuation by attenuator 20 remains fixed and equal to $1/k_1$, the arrangement will no longer be balanced. The coefficient $1/k_1$ applied to the output signal of the power amplification chain by attenuator 20 is consequently dependent on the variations of $k_1$ in the amplification chain. This uses as a basis the d.c. voltage at the output of analog divider 22. For this purpose the output signal of analog divider $u_m$ is filtered in low-pass filter 23, in order to eliminate all components due to the modulation. The output signal of low-pass filter 23 is consequently the control signal of adjustable attenuator 20. Thus, the "fast" defects which are a function of the input signal modulation are eliminated, no matter what the "slow" variations of the amplification chain gain, while retaining a constant quality, the correction being independent of the true output level. In order that the automatic correction system continues to operate, even when a considerable level drop is detected in the amplification chain, it is necessary to ensure that the adjustment of the attenuator control loop has adequate dynamics. Thus, the adjustable attenuator 20 comprises a three decibel coupler according to a preferred embodiment of the invention and in this the reflection coefficient is varied by a PIN diode control. An embodiment of this attenuator is shown in FIG. 3. The output of detector 21 is connected to the first input of a 3 dB coupler C, whereof a second input forms the output of the attenuator. The third and fourth inputs are connected to the control input via capacitors $C_1$, $C_2$ respectively and resistors $R_1$, $R_2$ respectively, the points common to the resistors and capacitors being connected to earth via the PIN diodes $D_1$ and $D_2$.

With regards to analog divider 22, at present there are no dividers which are fast enough to work in the complete video signal band. Therefore the analog divider is constructed by means of a multiplier, fitted in the negative feedback loop of an operational amplifier having a sufficiently broad transfer band to enable all the video signals to be transmitted.

Figure 4:
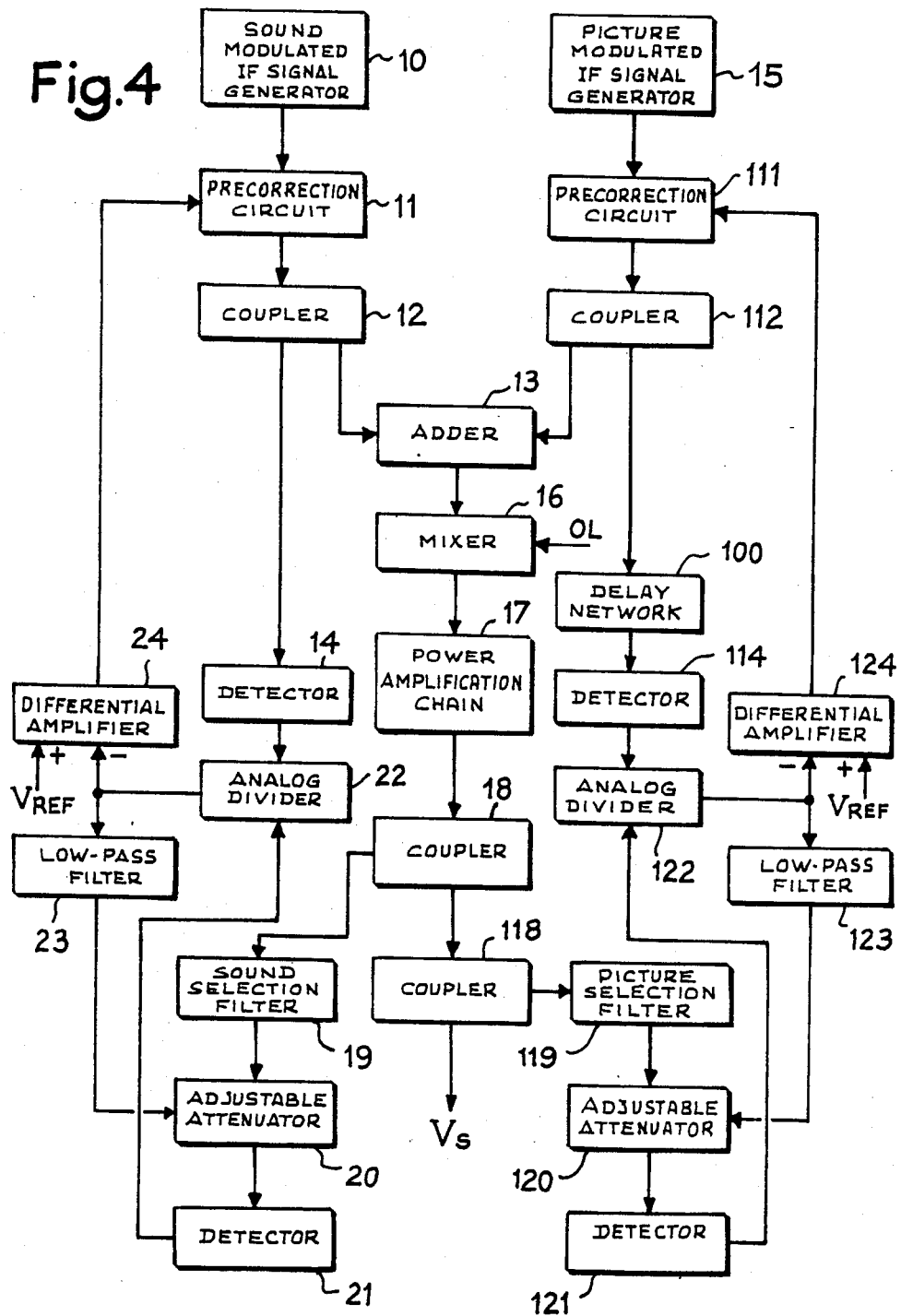
FIG. 4 is a block diagram of a second embodiment of the precorrection device according to the invention.

FIG. 4 shows a precorrection device which also makes it possible to correct the distortions on the picture carrier. The same elements as in FIG. 1 are designated by the same references and elements relating to the processing of the picture carrier have been designated by references increased by 100.

In order to be able to carry out corrections of the distortions of the picture component in the same arrangement, a precorrection circuit 111 and a coupler 112 are arranged in series between the output of the picture-modulated signal generator 15 and the corresponding input of adder 13. The second output of the coupler is connected to a picture modulation detection device 114, while another coupler 118 is located at the output of the power amplification chain in order to supply the picture distortion detection loop, which then has a picture selection filter 119 tuned to the picture component transmission carrier frequency followed by an adjustable attenuator 120 and an amplitude modulation detector 121. In the same way as hereinbefore, the output of the picture signal detector before amplification and the output of the picture signal detection chain after amplification are connected to the inputs of an analog divider 122, whose output controls the precorrection circuit 111 placed in the picture channel before joining the picture and sound components. However, for processing the components at the picture frequency, it is necessary to introduce into the detection channel of the signal prior to summation a delay network 100, in order to compensate the delay introduced into the power amplification chain and which is generally a function of the transmitter frequency. In order to obtain a standard automatic correction circuit, it is useful to provide a fixed delay line and a variable delay line, in order to adjust the delay introduced into said channel at the transmitter frequency.

The invention is not limited to the embodiments described and shown. In particular, it has been assumed in FIG. 1 that the summation of the two components is carried out on the basis of intermediate frequency components and in this case the detection of the modulation of the sound component prior to summation is carried out in intermediate frequency, while the detection of the modulation of the sound component after summation is carried out in VHF at the transmission frequency. It is obvious that if the summation takes place in VHF, the two detections can both be carried out in VHF or, as in the embodiment described, the preamplification signal detection can be carried out upstream in the intermediate frequency channel. Moreover, the correction device described hereinbefore has been directed at the simultaneous correction of cross modulation and intermodulation in a common channel transmitter or rebroadcasting transmitter but these automatic correction devices can equally well be used for the intermodulation correction of only one of the components, when the said components are amplified separately, the non-linearity distortion then being only from the intermodulation. In this case, it is not worth providing a filter at the amplification chain output.

What is claimed is:

1. Apparatus for precorrection of non-linearities in a power amplification chain of a television transmitter, the amplification chain having a gain, the apparatus comprising:
   first and second channels respectively connected to an input and an output of the amplification chain for sampling a transmitted signal, the first channel including a first detector circuit for receiving a portion of the signal and the second channel including a second detector circuit for selecting a fraction of a composite sound and picture signal, the composite signal having an amplitude, the second channel further including an attenuator having an output connected to an input of the second detector circuit, the attenuator having an attenuation coefficient equal to a part of the gain of the amplification chain which is independent of the amplitude of the composite signal for cancelling variations in said part of the gain;
   an analog divider having a first input connected to an output of the first detector circuit and a second input connected to an output of the second detector circuit, the analog divider further having an output; and
   an adjustable attenuation precorrection circuit having a control input connected to the output of the analog divider, the precorrection circuit being situated in front of the amplification chain for correcting intermodulations of signals on modulated carriers and cross modulation between individual modulated carriers.

2. Apparatus according to claim 1, wherein the second channel further comprises a circuit for filtering a to-be-corrected carrier, the to-be-corrected carrier further being fed to the analog divider, whereby the to-be-corrected carrier is filtered for correcting cross modulation between the to-be-corrected carrier and several carrier components, the components being added to the to-be-corrected carrier prior to the amplification thereof by the amplification chain.

3. Apparatus according to claim 1, wherein, for correcting non-linearities in a picture carrier of the composite transmitted signal, the first channel further comprises a delay network tuned to the transmission frequency of the picture carrier.

4. Apparatus according to claim 1, wherein the adjustable attenuation precorrection circuit is a PIN diode adjustable attenuator circuit.

5. Apparatus according to claim 1, wherein the attenuator in the second channel is an adjustable attenuator controlled by slow variations of a d.c. component of the output signal of the analog divider, and wherein the attenuator and the analog divider have interposed therebetween a low pass filtering circuit having an input connected to the output of the analog divider and an output connected to a control input of the adjustable attenuator.

6. Apparatus for correcting cross modulation between a picture carrier and a sound carrier in a common power amplification chain of a television transmitter, the amplification chain having a gain, the apparatus comprising:

an audio transmission channel including:
(a) first and second circuits connected to an input and an output, respectively, of the amplification chain for sampling an audio signal, the first circuit including a precorrection circuit situated before the power amplification chain, the first circuit further having a first means for detecting a portion of the audio signal and the second circuit having a second means for detecting a portion of a composite audio and video signal, the composite signal having an amplitude;
(b) an attenuator connected to the second detecting means, the attenuator having an attenuation coefficient equal to a part of the gain of the amplification chain which is independent of the amplitude of the composite signal for cancelling variations in said part of the gain;
(c) first filter means connected to the attenuator for filtering an audio carrier to be fed to an analog divider, the analog divider having first and second inputs connected to the first and second detecting means, respectively; and a video transmission channel including:
(d) third and fourth circuits connected to the input and output, respectively, of the amplification chain for sampling a video signal, the third circuit including a second precorrection circuit situated before the power amplification chain, the third circuit further having a first means for detecting a portion of the video signal and the fourth circuit having a second means for detecting a portion of the composite audio and video signal;
(e) a second attenuator connected to the second detecting means of the fourth circuit, the attenuator having an attenuation coefficient equal to a part of the gain of the amplification chain which is independent of the amplitude of the composite signal for cancelling variations in said part of the gain;
(f) a second filter means connected to said second attenuator for filtering a video carrier to be fed to a second analog divider, the second analog divider having a first input connected to the first detecting means of the third circuit and second input connected to the second detecting means of the fourth circuit;

whereby the cross modulation between the audio and video carriers is corrected.

* * * * *